(12) United States Patent
Christian et al.

(10) Patent No.: US 6,882,266 B2
(45) Date of Patent: Apr. 19, 2005

(54) BALL GRID ARRAY RESISTOR NETWORK HAVING A GROUND PLANE

(75) Inventors: David A. Christian, deceased, late of Fort Wayne, IN (US); by Cynthia A. Christian, legal representative, Fort Wayne, IN (US); Richard Cooper, Bluffton, IN (US); Yinggang Tu, Elkhart, IN (US)

(73) Assignee: CTS Corporation, Elkhart, IN (US)

( * ) Notice: Subject to any disclaimer, the term of this patent is extended or adjusted under 35 U.S.C. 154(b) by 154 days.

(21) Appl. No.: 10/337,633

(22) Filed: Jan. 7, 2003

(65) Prior Publication Data

US 2004/0130435 A1 Jul. 8, 2004

(Under 37 CFR 1.47)

(51) Int. Cl.[7] ............................................. H01C 1/012
(52) U.S. Cl. .......................... 338/320; 338/309; 338/51
(58) Field of Search ................................ 338/320, 309, 338/51

(56) References Cited

U.S. PATENT DOCUMENTS

| | | | |
|---|---|---|---|
| 4,310,812 A | * | 1/1982 | DeBloois .................. 333/81 A |
| 5,179,366 A | * | 1/1993 | Wagner ....................... 338/313 |
| 5,708,569 A | * | 1/1998 | Howard et al. .............. 361/760 |
| 5,741,729 A | | 4/1998 | Selna |
| 5,866,943 A | | 2/1999 | Mertol |
| 5,977,863 A | | 11/1999 | Bloom |
| 6,005,777 A | | 12/1999 | Bloom |
| 6,020,637 A | | 2/2000 | Karnezos |
| 6,097,277 A | | 8/2000 | Ginn |
| 6,108,212 A | | 8/2000 | Lach |
| 6,194,979 B1 | | 2/2001 | Bloom |
| 6,323,065 B1 | | 11/2001 | Karnezos |
| 6,326,677 B1 | | 12/2001 | Bloom |
| 2002/0118094 A1 | * | 8/2002 | Kambara et al. ........... 338/309 |
| 2003/0024732 A1 | * | 2/2003 | Ninomiya ................... 174/255 |
| 2004/0037058 A1 | * | 2/2004 | Ernsberger et al. ......... 361/763 |
| 2004/0108937 A1 | * | 6/2004 | Ernsberger et al. ......... 338/309 |

* cited by examiner

*Primary Examiner*—Karl D. Easthom
(74) *Attorney, Agent, or Firm*—Mark P. Bourgeois

(57) ABSTRACT

A ball grid array resistor network that has a ground plane to reduce noise and improve signal integrity. The ball grid array resistor network includes a substrate having a first and a second surface and vias that extending through the substrate between the first and second surfaces. Resistors are located on the first surface between the vias. Conductors are located over the vias and are electrically connected to ends of the resistors. A cover coat covers the conductors and resistors. A ground plane is located on the second surface. An insulating layer is located over the ground plane. Ball pads are located over the vias. The ball pads are electrically connected to the vias. Solder spheres are attached to the ball pads.

9 Claims, 3 Drawing Sheets

BALL GRID ARRAY RESISTOR NETWORK HAVING A GROUND PLANE

CROSS REFERENCE TO RELATED APPLICATIONS

The present application is related to U.S. Pat. No. 6,326,677.

BACKGROUND

1. Field of the Invention

This invention generally relates to shielding of a dense package in a high frequency environment. The invention further relates to isolation and impedance matching for electronics. Specifically, the invention is a group of resistors mounted in a high density network or array package with a ground plane that uses solder balls to connect with a circuit board.

2. Description of the Related Art

Resistor networks are commonly used to terminate high speed digital signal lines to minimize unwanted reflections back through the transmission structure by matching the impedance of the transmission structure. In most applications, the terminations are made by placing a resistor matching the impedance of the transmission line at the end of the transmission line. One end of the resistor is connected to a common termination voltage and the other end is connected to the signal line.

One problem that can occur in electronic packages is that electromagnetic energy may be coupled between adjacent conductors such as circuit lines. The adjacent conductors may be above each other or may be side by side in the same plane. The circuit lines may be next to each other on the same plane or may be coupled in between different planes. For example, electromagnetic energy can be coupled from a printed circuit board to a component mounted above the board and vice-versa.

In high speed, high density circuits, it is desirable to minimize reflected signal energy due to impedance mismatches in order to improve signal integrity and have low noise induced on circuit lines located in close proximity. Impedance is the opposition that an electronic component, circuit, or system offers to alternating and/or direct electric current flow. The impedance has two components: a real component and an imaginary component. Impedance is a vector quantity that is measured and quantified as resistance and reactance.

Resistance is a measure of the extent to which a substance opposes the movement of electrons among its atoms. The more easily the atoms give up and/or accept electrons, the lower the resistance. Resistance is expressed by a positive real number measured in ohms. Resistance can be measured with alternating current (AC) and also with direct current (DC).

Reactance is an expression of the extent to which an electronic component, circuit, or system stores and releases energy as the current and voltage fluctuate with each AC cycle. Reactance is expressed by an imaginary number in ohms. It is observed for AC current, but not for DC current. When alternating current passes through a component that contains reactance, energy might be stored and released in the form of a magnetic field, in which case the reactance is inductive (denoted+jXL). In another case, energy might be stored and released in the form of an electric field, in which case the reactance is capacitive (denoted−jXC). The formula for inductive reactance is XL=2 πfL. Where L is inductance and f is frequency. The formula for capacitive reactance is XC=2 πfC. Where C is capacitance and f is frequency.

Reactance is multiplied by the positive square root of −1, which is the unit imaginary number called the j operator, to express impedance (Z) as a complex number of the form R+jXL (when the reactance is inductive) or R−jXC (when the reactance is capacitive). For example, if a resistance of 100 ohms is connected in series with an inductance of 10 nh and operated at 4.0000 MHz, the impedance is given by ZRL=R+jXL, where X is given by 2 πf and f is frequency. Multiplying the terms gives ZRL=100.00+j.251.

In order to have low cross-talk noise and minimize reflections, It is desirable to have a low reactive element of the resistive component of the impedance approximately the same as the resistance of the resistor network. For low resistance values, the reactive part of the impedance is due to the parasitic capacitance and inductance of the resistor package and typically results in a reactance that is above the resistor value. Due to space constraints and the dielectric constants of the substrate materials used, it is difficult to achieve a well matched impedance value in present resistor networks.

Therefore, there is a current unmet and heretofore long felt need for a resistor network that has low cross-talk noise, improved signal integrity, improved shielding and can be designed with a range of matching impedances.

SUMMARY

It is a feature of the invention to provide a ball grid array resistor network that has low coupled noise.

It is a feature of the invention to provide a ball grid array resistor network that includes a substrate having a first and a second surface and a plurality of vias extending through the substrate between the first and second surfaces. A plurality of resistors are disposed on the first surface and are located between the vias. A plurality of conductors are disposed on the first surface over the vias and are electrically connected to an end of at least one resistor. A cover coat covers the conductors and resistors. A ground plane is located on the second surface. An insulating layer is located over the ground plane. A plurality of ball pads are located over the vias and partially over the insulating layer. The ball pads are electrically connected to the vias. A plurality of solder spheres are attached to the ball pads and are electrically connected thereto.

It is noted that the drawings of the invention are not to scale.

DETAILED DESCRIPTION

Figure 1:
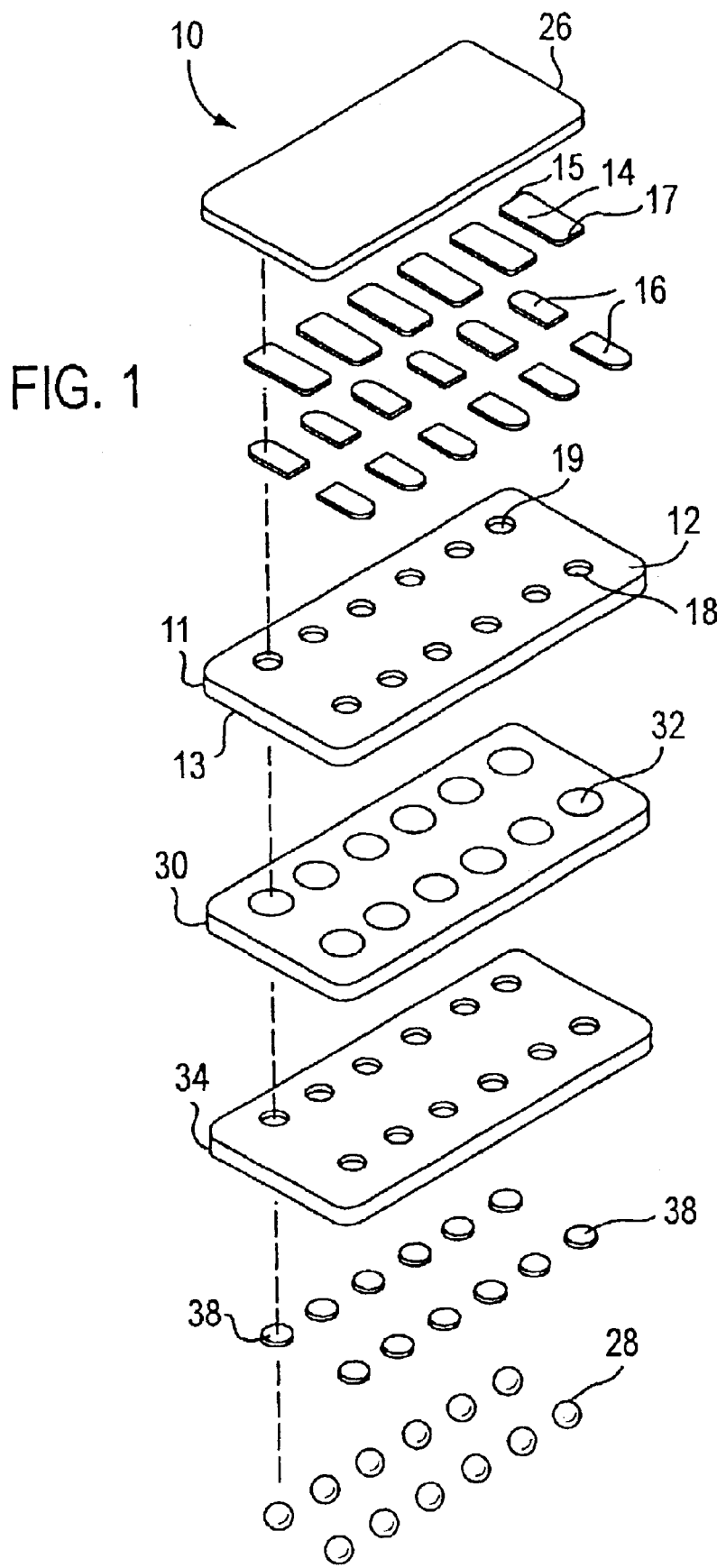
FIG. 1 is an exploded perspective view of a ball grid array resistor network having a ground plane.
Figure 2:
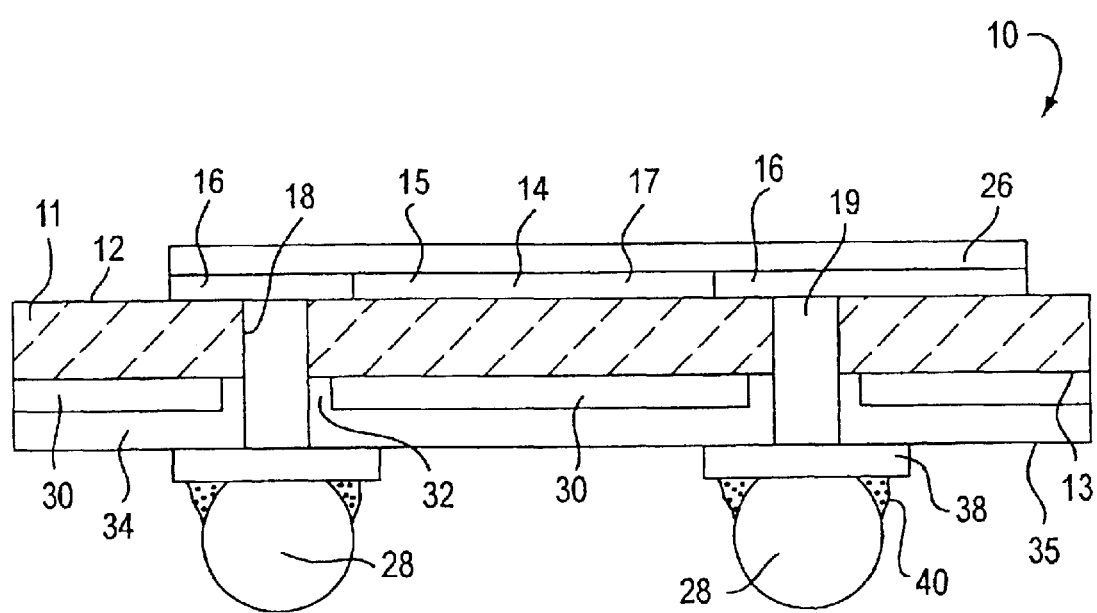
FIG. 2 is a cross-sectional view of FIG. 1 in its assembled state.

Referring to FIGS. 1 and 2, there is a ball grid array resistor network assembly 10. In particular, resistor network assembly 10 has a planar substrate 11 having a top surface 12 and a bottom surface 13. Substrate 11 is preferably made out of a ceramic material such as alumina oxide. Substrate 11 has holes or vias 18 that are formed prior to firing the alumina ceramic. Resistors 14 are disposed and trimmed on the top surface 12 by conventional thick film resistor processing techniques. These techniques are detailed in U.S. Pat. No. 6,326,677, which is herein incorporated by reference.

Resistors 14 have a first end 15 and a second end 17. Conductors 16 are disposed on the top surface 12 by conventional thick film conductor processing techniques. Conductors 16 are placed on each end 15 and 17 of resistors 14 and are electrically connected to ends 15 and 17. Conductors 16 and resistors 14 slightly overlap and sinter to form a mechanical and electrical bond during processing.

A ground plane 30 is located over bottom surface 13. Ground plane 30 is preferably formed from the same thick film material as conductors 16. Ground plane 30 is electrically connected to one or more of the vias (not shown) in order to create a plane throughout the network that is held at a common ground potential. An insulating layer 34 is located over ground plane 30. Insulating layer 34 is preferably formed from a thick film dielectric insulator such as a glass ceramic frit. Layer 34 has a bottom surface 35.

The ground plane serves several purposes. The ground plane protects the resistors and conductors from outside noise or unwanted signals such as from the circuit board to which it is mounted. The ground plane protects the circuit board by containing any radiated electromagnetic energy from the resistors. Additionally, the ground plane creates a more uniform signal to ground capacitance and as such allows the impedance looking into the resistor network to be more uniform across all resistors in the network.

Several bottom conductors or ball pads 38 are located over portions of insulating layer 34. Cylindrical vias 18 extend through substrate 11, ground plane 30 and insulating layer 34. Vias 18 are filled with a conductive via fill material 19. The via fill material 19 is a conventional thick film conductor that is screened or extruded into the vias and fired. The via fill material 19 electrically connects the conductors 16 to ball pads 38. Circular areas 32 around via 18 contain the insulating material 34 and insulate the via from the ground plane. Solder spheres 28 are mechanically and electrically attached to the ball pads 38. Solder spheres may be 10% tin and 90% lead and are commercially available from Alpha Metals Corporation. The solder spheres can be other alloys such as 5–20% tin and 80–95% lead. Solder spheres 28 may be partially melted to attach to the conductors 38, typically using a screened solder paste 40. Solder sphere 28 typically connects to an external electrical circuit such as on a printed circuit board. A cover coat 26 is placed over the resistors 14 and the conductors 16 to protect them from corrosion and abrasion.

Resistor network assembly 10 is assembled by the following process sequence: First, ground plane 30 is screened onto bottom surface 13 of substrate 11 and fired in an oven. Insulating layer 34 is then screened onto ground plane 30 and fired in an oven. Via fill material 19 is then screened into vias 18 and fired in an oven. The conductors 16 are screened onto top surface 12 and fired in an oven. Ball pads 38 are screened onto bottom surface 13 and fired in an oven. The resistors 14 are screened onto top surface 12 and fired in an oven. Next, the resistors 14 are laser trimmed to their proper resistance value and a cover coat 26 is screened on and cured. Solder paste 40 is screened onto ball pads 38. Solder spheres 28 are placed onto ball pads 38 and reflowed to bond to ball pads 38. Finally, the assembly 10 is tested. The resistors, conductors, ball pads, ground plane and insulating layers would be screened through a patterned mesh screen. The vias could be screened through a patterned mesh screen or could be extruded using a pressurized bladder.

Figure 3:
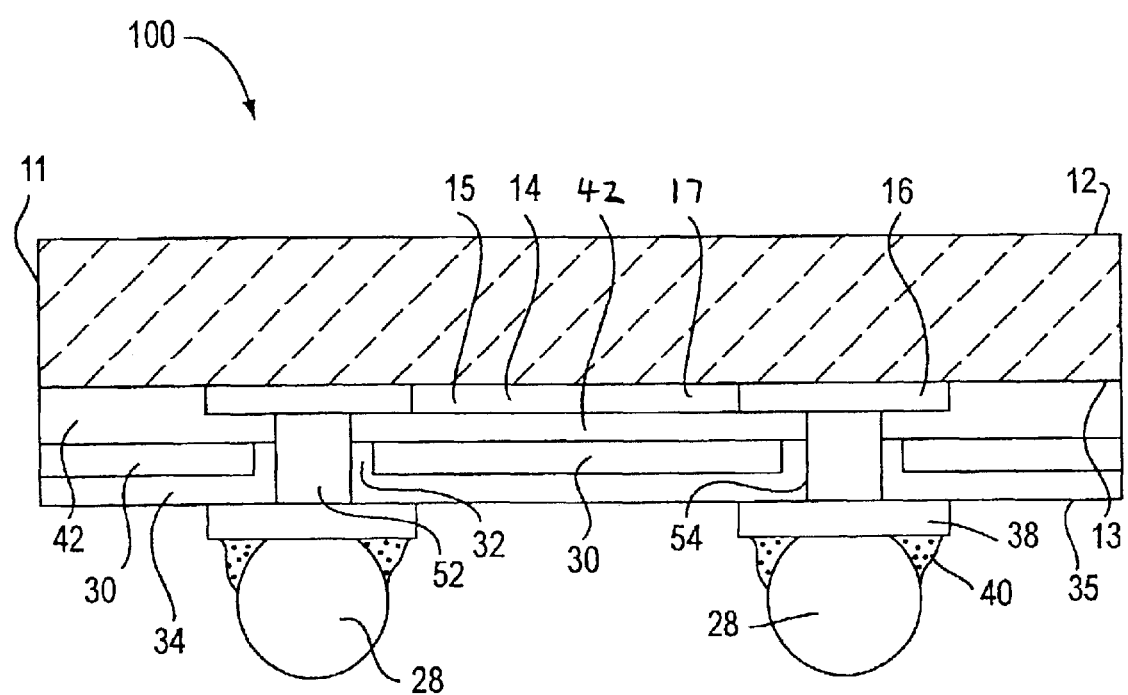
FIG. 3 is a cross-sectional view of an alternative embodiment.

FIG. 3 shows a cross-sectional view of an alternative embodiment of the ball grid array resistor network with a ground plane. Referring to FIG. 3, elements that are in common to FIGS. 1 and 2 are given the same reference designator. A resistor network assembly 100 has a substrate 11 to which conductors 16 are attached on bottom surface 13. Substrate 11 is preferably made out of a ceramic material such as alumina oxide. Resistors 14 are disposed and trimmed on the bottom surface 13 by conventional thick film resistor processing techniques. Resistors 14 have a first end 15 and a second end 17. Conductors 16 are disposed on the bottom surface 13 by conventional thick film conductor processing techniques. Conductors 16 are located on each end 15 and 17 of resistors 14 and are electrically connected to ends 15 and 17. Conductors 16 and resistors 14 slightly overlap and sinter to form a mechanical and electrical bond during processing.

An insulating layer or glass cover coat 42 is located over and covers the resistors 14, conductors 16 and bottom surface 13. The glass cover coat is deposited using conventional thick film processing techniques. A ground plane 30 is located over insulating layer 42. Ground plane 30 is preferably formed from the same thick film material as conductors 16. Another insulating layer 34 is located over ground plane 30. Insulating layer 34 is preferably formed from a thick film dielectric insulator such as a glass ceramic frit. Layer 34 has a bottom surface 35.

Several bottom conductors or ball pads 38 are located over portions of insulating layer 34. Short cylindrical vias 54 extend through insulating layers 42 and 34 and ground plane 30. Vias 54 are filled with a conductive via fill material 52.

Circular areas 32 around via 54 contain the insulating material 34 and insulate the via from the ground plane. An electrical interconnect or solder spheres 28 are mechanically and electrically attached to ball pads 38. Solder spheres 28 may be 10% tin and 90% lead and are commercially available from Alpha Metals Corporation. The solder composition could be other alloys such as from 5–20% tin and from 80–95% lead. The solder spheres 28 may be partially melted to attach to the conductors 16, typically using a screened on solder paste 40. Alternatively, the solder spheres could be formed as a bump of reflowed solder paste. Solder sphere 28 typically connects to an external electrical circuit such as on a printed circuit board (not shown). Resistor network 100 avoids the use of a ceramic substrate 11 with holes. The ground plane 30 would be connected to one or more of the via conductors 52 in order to connect to a ground potential.

Resistor network assembly 100 is assembled by the following process sequence:

Conductors 16 are screened onto bottom surface 13 and fired in an oven. Resistors 14 are screened onto bottom surface 13 and fired in an oven. Next, resistors 14 are laser trimmed to their proper resistance value. Insulating layer 42 is screened on over the resistors and conductors and fired in an oven. Next, ground plane 30 is screened over insulating layer 42 and fired in an oven. Insulating layer 34 is then screened onto ground plane 30 and fired in an oven. During the screening of layers 42, 34 and ground plane 30 openings are formed such that via 54 is formed. A Via fill material 52 is then screened into vias 54 and fired in an oven. Ball pads 38 are screened onto insulating layer 34 and vias 54 and fired in an oven. Solder paste 40 is screened onto conductors 16. Solder spheres 28 are placed onto ball pads 38 and reflowed to bond to the ball pads. Finally, the assembly 10 is tested.

The resistor network can be electrically modeled as a small pad connected to the ground plane, the resistor and a small section of transmission line with certain characteristic impedance usually 50 Ohms. The transmission line section is used as the resistor termination, which can be connected to solder spheres or bumps. The use of a common ground plane and transmission line section greatly reduces the parasitic parameters and achieves uniform impedance over a wide frequency span.

One of ordinary skill in the art of making resistors, will realize that there are many different ways of accomplishing the preferred embodiment. For example, although it is contemplated to make substrate 11 out of ceramic, other suitable materials would work, like polyamide or FR4. These materials would require a different resistor system. Additionally, although six resistors were shown on substrate 11. More or fewer resistors could be used. Additionally more or fewer rows of solder spheres could be used.

If desired, other electrical functions could be added to resistor network 10 or 100 such as capacitors or inductors to make a filter, for example.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A ball grid array resistor network, comprising:
    a) a substrate having a first and a second surface;
    b) a plurality of resistors disposed on the first surface;
    c) a plurality of conductors, disposed on the first surface and electrically connected to an end of at least one resistor;
    d) a first insulating layer located over the resistors and the conductors;
    e) a ground plane located on the first insulating layer;
    f) an second insulating layer located over the ground plane;
    g) a plurality of vias extending through the first and second insulating layers, the vias each having a first and a second end, the first end electrically connected to the conductors;
    h) a plurality of ball pads located over the second end of the vias and partially over the second insulating layer, the ball pads electrically connected to the second end of the vias; and
    i) a plurality of electrical interconnects attached to the ball pads.

2. The ball grid array resistor network according to claim 1, wherein the substrate is ceramic.

3. The ball grid array resistor network according to claim 1 wherein the electrical interconnect is a plurality of solder spheres.

4. The ball grid array resistor network according to claim 1, wherein the electrical interconnect is a reflowed solder paste.

5. The ball grid array resistor network according to claim 1, wherein the resistors, conductors, ball pads, ground plane and insulating layers are deposited through a patterned mesh screen.

6. The ball grid array resistor network according to claim 1, wherein the second insulating layer circumferentially surrounds the vias between the vias and the ground plane.

7. A ball grid array resistor network, comprising:
    a) a substrate having a first and a second surface;
    b) a plurality of resistors mounted on the first surface;
    c) a first insulating layer located over the resistors;
    d) a ground plane located over the insulating layer;
    e) a second insulating layer located over the ground plane;
    f) a plurality of conductive pads located on the second insulating layer, the resistors being electrically connected to the pads;
    g) a plurality of conductive spheres attached to the conductive pads: and
    h) a plurality of vias connected between the conductive pads and the resistors.

8. The ball grid array resistor network according to claim 7, wherein the conductive sphere is a solder sphere.

9. The ball grid array resistor network according to claim 8, wherein a conductor is connected to each end of the resistor.

* * * * *